United States Patent
Apostolos

Patent Number: 6,121,856
Date of Patent: Sep. 19, 2000

[54] BULK ACOUSTIC WAVE DEVICE WITH LAMB WAVE MODE SELECTION

[75] Inventor: John T. Apostolos, Merrimack, N.H.

[73] Assignee: Lockheed Martin Corporation, Nashua, N.H.

[21] Appl. No.: 09/138,216

[22] Filed: Aug. 21, 1998

[51] Int. Cl.[7] .............................. H03H 9/36; H03H 9/46
[52] U.S. Cl. .................... 333/141; 333/147; 333/149; 333/150; 333/186; 310/328; 310/334
[58] Field of Search .................................. 333/141, 145, 333/147, 149, 150, 154, 186, 187, 193; 310/328, 334

[56] References Cited

U.S. PATENT DOCUMENTS

| | | | |
|---|---|---|---|
| 4,123,731 | 10/1978 | Kanbara et al. | 333/141 |
| 4,404,852 | 9/1983 | Goto | 73/599 |
| 4,443,731 | 4/1984 | Butler et al. | 310/334 |
| 5,129,262 | 7/1992 | White et al. | 310/313 R X |
| 5,163,435 | 11/1992 | Soldner et al. | 333/141 X |
| 5,633,616 | 5/1997 | Goto | 333/193 |

OTHER PUBLICATIONS

Y. Mao et al.; "Switchable Single Mode Lamb Wave Transduction by Means of Both Side Excitation"; 1995 IEEE Ultrasonics Symposium; pp. 807–810, 1995.

*Primary Examiner*—Robert Pascal
*Assistant Examiner*—Barbara Summons
*Attorney, Agent, or Firm*—David W. Gomes; Joseph E. Funk

[57] ABSTRACT

A bulk acoustic wave delay line is disclosed having a thin, amorphous metal substrate, and deposited on the first and second surface at each end of which is a very thin layer of a piezoelectric material. Positioned on each piezoelectric material layered area are a plurality of interleaved electrodes with a first portion of each plurality of electrodes being interconnected and a second portion of each plurality of electrodes being interconnected. The electrodes on the first and second surface at one end of said device are energized with electrical signals in a phased or un-phased manner to generate selected modes of pure Lamb waves in said substrate.

10 Claims, 4 Drawing Sheets

BOTTOM VIEW

BULK ACOUSTIC WAVE DEVICE WITH LAMB WAVE MODE SELECTION

FIELD OF THE INVENTION

This invention relates to the field of acoustic wave devices having mode selection capability, and more particularly to bulk acoustic wave devices used as delay lines.

BACKGROUND OF THE INVENTION

Acoustic wave device operating principles are well-known in the prior art. Early theory for wave propagation in multi-layered media was introduced by Lord Rayleigh in the last century and resulted in a derivation for acoustic waves traveling along the free surface of a semi-infinite elastic half-space. This derivation predicted an expression of the velocity of the propagating surface wave. Later, Stoneley described waves traveling along the interface between two different elastic solids. Subsequent studies addressed the conditions when these waves travel without leaking into the solids and formed the leaky wave theory. Lamb added another interface to introduce a flat layer of finite thickness. His derivation predicted symmetric modes and anti-symmetric modes in what has become well-known in the art as Lamb wave dispersion curves.

Lamb waves are commonly used to make measurements, for example, measurements of elastic properties of plate and shell structures. Studies have been conducted to monitor fatigue damage in composite samples using Lamb wave velocity measurements. Other measurements that may be made include monitoring of ultrasonic flexural Lamb waves in thin films for sensing and actuation of devices. In additional applications, the Raleigh—Lamb dispersion relation that governs the propagation of Lamb waves in free, homogenous, isotropic plates is used to derive the dispersion relation for the lowest order flexural (M21) mode in terms of in-plane tension, stiffness, mass per unit area and rotary inertia.

However, Lamb waves often exist in both lower and higher order modes simultaneously making the interpretation of the wave data more complex and difficult. Recent research includes the use of transducers mounted at the front end of a specimen to increase mode sensitivity by selectively exciting lower order symmetric (M11) and anti-symmetric (M21) Lamb wave modes in thin solid plates. Reference, for example, the research of F. Levent Degertekin and Butrus T. Khuri-Yakubal in a paper entitled "Single Mode Lamb Wave Exitation In Thin Plates By Hertzian Contacts" printed in Applied Physics Letter 69 (2) on Jul. 8, 1996. This research used Hertzian contacts formed between the plates and the end of specially designed quartz rods which guide extensional waves generated by transducers bonded at the end of the rods.

It is also known in the prior art that the use of an amorphous metal as a delay line may provide electrically efficient performance. Reference, for example, a paper written by Webb, Gorester, Ganguly and Vittoria for the Naval Research Laboratory that used a magnetostrictive ribbon for experimentation. Those concerned with the use and development of acoustic wave devices recognize the need in the art for a simple, low-cost, miniature device that can excite pure, lower order Lamb waves.

SUMMARY OF THE INVENTION

It is an object of the present invention to provide a bulk acoustic wave device that can excite multiple modes of Lamb waves.

It is a further object of this invention to provide a bulk acoustic wave device capable of selectively exciting symmetric mode M11 and asymmetric mode M21 Lamb waves.

It is yet a further object of this invention to provide a bulk acoustic wave line that can excite selected pure modes of Lamb waves.

To attain these and other objects of the invention, the present invention is a bulk acoustic wave device comprising a solid, amorphous metal substrate on which a piezoelectric transducer is mounted on both its upper and lower surfaces and at either end of the delay line device. This device receives an electrical signal at its input and the signal is selectively applied to contact electrodes on the upper and lower transducers at one end of the device. These input transducers convert the signal into acoustic waves that travel the length of the device. When the acoustic waves travel through the amorphous metal substrate of the device and strike with the upper and lower transducers at the opposite end of the device, they are reconverted into an electrical signal that is output from the device. Each transducer has contact electrodes thereon that are selectively energized with the input electrical signal so as to excite selected, pure, low order Lamb waves in the device. A thin layer of absorbent material is applied to the edges of the substrate material to minimize impedance reflections in the device.

BRIEF DESCRIPTION OF THE DRAWING

The invention, and the objects and advantages thereof will be better understood upon reading the following Detailed Description in conjunction with the drawings in which.

DETAILED DESCRIPTION

Figure 1:
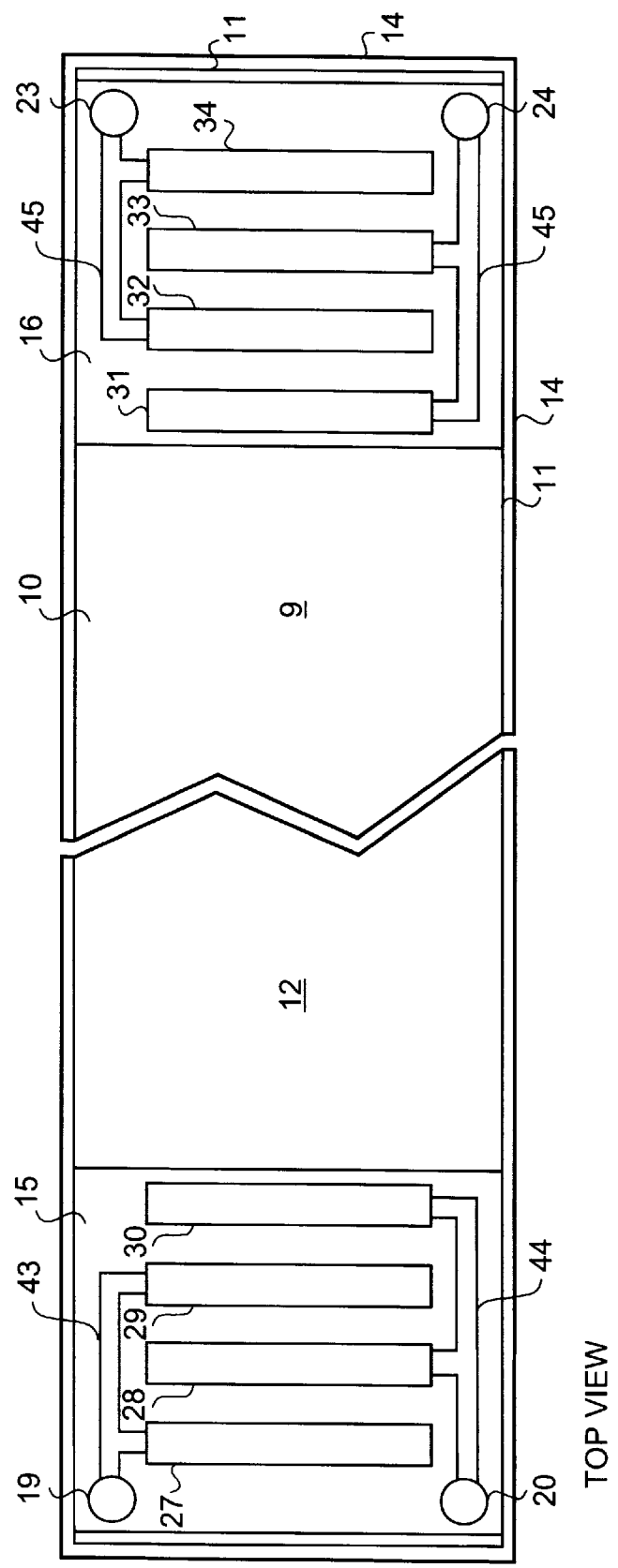
FIG. 1 is a top view of a bulk acoustic wave device in accordance with a preferred embodiment of the present invention.
Figure 2:
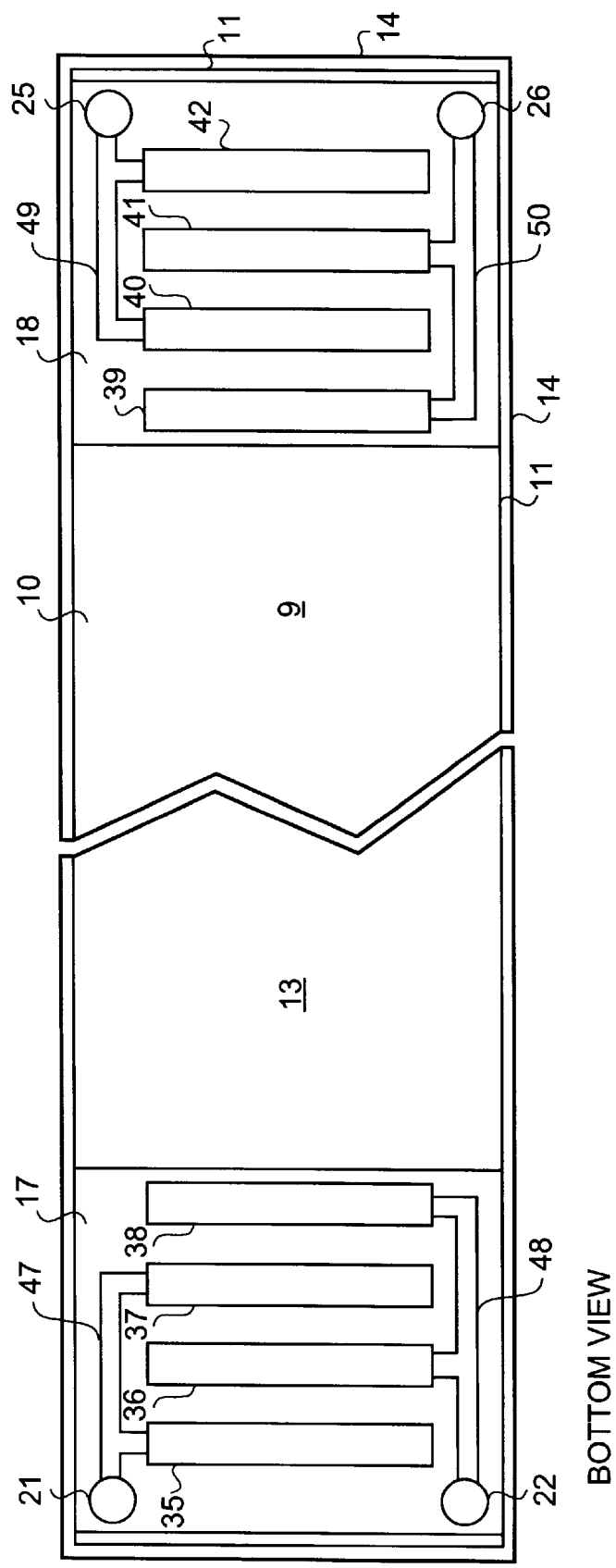
FIG. 2 is a bottom view of a bulk acoustic wave device in accordance with a preferred embodiment of the invention.
Figure 3:
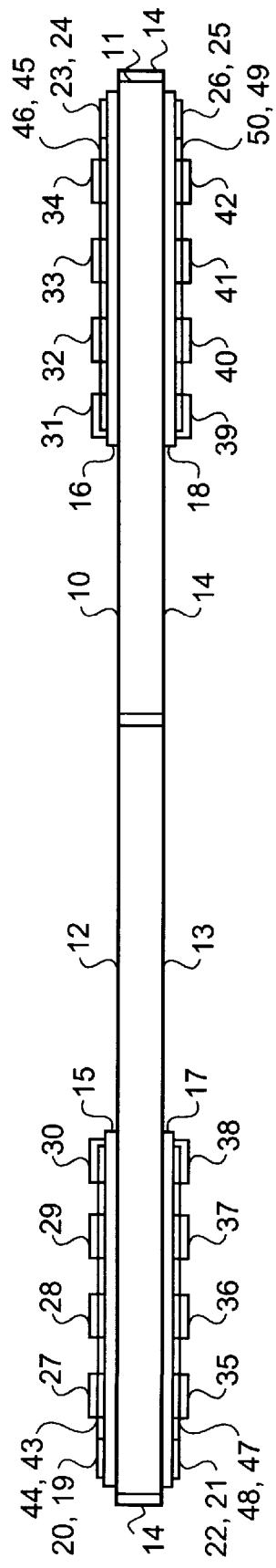
FIG. 3 is a side view of a bulk acoustic wave device in accordance with a preferred embodiment of the invention.

FIGS. 1 through 3 respectively show top, bottom and side views of a bulk acoustic wave device delay line 9 in accordance with a preferred embodiment of the invention. The spacing and dimensions of elements shown in these Figures are not drawn to any scale, but instead are chosen to best show the elements and their relationship to each other. A break is shown in the middle of substrate 10 in FIGS. 1 through 3 which does not actually exist, but is shown for convenience to compress the length of the delay line in those Figures.

FIG. 1 shows a top view of a bulk acoustic wave device delay line 9 in accordance with the teaching of the invention. Delay line 9 comprises a thin, amorphous metal substrate 10 which has a thickness in the order of one-thousandth of an inch at its edges 11. The exact thickness of substrate 10 should equal one-half wavelength at the center frequency of the delay line in the dispersive mode, M11. An amorphous metal is a glass like metal or metallic alloy having no micro-crystalline or grain structure. An amorphous metal provides extremely low attenuation of acoustic signals which permits it to operate at frequencies up to 200 MHz, and provides extremely low spurious responses which reduces unwanted side lobes. In the selection of an amorphous metal from which to fabric substrate 10, trade-offs must be made between relative bandwidth, insertion loss, electrical resistivity, magnetostriction, and temperature stability. Examples of commercially available materials that can be used for making substrate 10 are metalized glass mediums such as METGLAS(R) magnetic alloys 2826 MB, 2705 M and 2605SA1. These three alloys are respectively iron-nickel, cobalt, and iron based amorphous materials. Each of these amorphous materials is produced by Allied Signal Inc. and are available at relatively low-cost.

Substrate 10 has an upper surface 12 that may be seen in FIGS. 1 and 3, but is not seen in FIG. 2 which is bottom view; and a lower surface 13 that may be seen in FIGS. 2 and 3, but is not seen in FIG. 1 which is a top view. On all edges 11 of substrate 10 is an absorbent material 14 which reduces dispersive mode signals in substrate 10.

Plated on a portion of both upper surface 12 and lower surface 13 at both ends of substrate 10 is a thin film coating 15, 16, 17 and 18 of a piezoelectric material as shown in FIGS. 1 and 2. This piezoelectric material is preferably zinc oxide but may be Lithium Niobate or another piezoelectric material. Zinc oxide plating 15, 16, 17 and 18 is several ten-thousands of an inch thick and is applied using any of the many well-known metal deposition techniques. Zinc oxide plating 15, 16, 17 and 18 provides very low attenuation to signals traveling therein. The piezoelectric material 15 and 17 is used to convert electrical input signals at input terminals 19 through 22 into acoustic waves in substrate 10, and the piezoelectric material 16 and 18 is used to convert the acoustic waves in substrate 10 back into delayed electrical signals to be output at output terminals 23 through 26.

Mounted on zinc oxide layers 15 through 18 are equally spaced, parallel electrodes, preferably made from aluminum, but they may be made from any other conductive material as shown in FIGS. 1 and 2. Input electrodes 27 through 30 are mounted on piezoelectric layer 15 (FIG. 1); output electrodes 31 through 34 are mounted on piezoelectric layer 16 (FIG. 1); input electrodes 35 through 38 are mounted on piezoelectric layer 17 (FIG. 2); and output electrodes 39 through 42 are mounted on piezoelectric layer 18 (FIG. 2). In FIG. 3 the orientation of electrodes on upper surface 12 and lower surface 13 to each other is shown.

All electrodes on upper surface 12 and lower surface 13 are mounted on the zinc oxide piezoelectric material 15 through 18 in a parallel, interlinear manner, as shown, using standard microwave insertion techniques. The electrodes on each of piezoelectric material 15 through 18 are spaced one-half wavelength apart at the designed center frequency of the delay line 9.

Alternate electrodes are connected together. In FIG. 1, electrodes 27 and 29 are interconnected by a bus 43 which is connected to input electrical contact 19, electrodes 28 and 30 are interconnected by a bus 44 which is connected to input electrical contact 20, electrodes 32 and 34 are interconnected by a bus 45 which is connected to output electrical contact 23, and electrodes 31 and 33 are interconnected by a bus 46 which is connected to output electrical contact 24. In FIG. 2, electrodes 35 and 37 are interconnected by a bus 47 which is connected to input electrical contact 21, electrodes 36 and 38 are interconnected by a bus 48 which is connected to input electrical contact 22, electrodes 40 and 42 are interconnected by a bus 49 which is connected to output electrical contact 25, and electrodes 39 and 41 are interconnected by a bus 50 which is connected to output electrical contact 26. The electrodes 19–26 and the buses 43–50 which interconnect them are formed using standard microwave plating and insertion techniques, such as photo etching.

Typically input contacts 19, 20, 21 and 22 are connected to a source of electrical signal which is input to delay line 9, and output contacts 23, 24, 25 and 26 are connected to extract the signal from the delay line 9.

Electrodes 27–30 on upper surface 12 (FIG. 1) cooperatively energize piezoelectric material 15, and electrodes 35–38 on lower surface 13 (FIG. 2) cooperatively energize piezoelectric material 17 to excite selected, pure modes M11 or M21 of Lamb waves in substrate 10. The amplitude of the acoustic signal is determined by the physical length of the input electrodes, and the phase of the signal is determined by the phase of the electrical signals applied to these input electrodes. The optimum electrode lengths and thickness are determined by semi-empirical means. Electrodes are spaced apart one half wavelength of the center frequency of the delay line. Adjustment of the length and spacing of the many electrodes making up bulk acoustic wave delay line device 9 permits the synthesis of any finite impulse response.

Piezoelectric material 16 and electrodes 31–34 on upper surface 12 (FIG. 1), and piezoelectric material 18 and electrodes 39–42 on lower surface 13 (FIG. 2) cooperatively act as a detector to convert acoustic waves in substrate 10 back into electrical signals that are output at output electrodes 23 through 26 and summed together into the delayed version of the electrical signal input to delay line 9.

Bulk acoustic devices, such as filters or time delay devices, can be constructed for use in either the frequency domain or in the time domain utilizing the teaching of the present invention. The bulk acoustic wave device delay line 9 constructed in accordance with the teaching of the present invention, including absorbent material 14 on all four edges 11, has a low reflection coefficient which reduces spurious modes during operation.

Referring now to FIG. 3, therein is shown a side view of bulk acoustic wave delay line 9 which implements the teaching of the present invention. In this Figure certain elements are physically located behind other elements, such as input electrical contact 19 being located behind input electrical contact 20. To reflect the fact that both input electrical contacts are there, while only one is physically shown, the contact that is shown is marked 20, 19. The foremost (visible) contact 20 is indicated by the first number, and the rearmost (non-visible) contact 19 is indicated by the second number. This numbering scheme is also used for the other contacts and busses in FIG. 3.

Zinc oxide piezoelectric material 15 is shown on the upper surface 12 at the left end of amorphous metal substrate 10, zinc oxide piezoelectric material 17 is shown on the lower surface 13 at the left end of substrate 10, zinc oxide piezoelectric material 16 is shown on the upper surface 12 at the right end of substrate 10, and zinc oxide piezoelectric material 18 is shown on the lower surface 13 at the right end of substrate 10. The interleaved electrodes 27–30, 35–38, 31–34, and 39–42 on the zinc oxide plated areas are shown, but the interconnecting busses 43–50 are only shown and designated as described in the previous paragraph.

With the bulk acoustic wave delay line 9 shown in FIGS. 1 through 3 acoustic waves can be generated by piezoelectric substrates 15 and 17 at the left end of delay line 9 when a signal is applied to electrodes 19–22. The acoustic wave propagates to the right end of delay line 9 where piezoelectric material 16 and 18 reconvert the acoustic wave into the electrical signal, but delayed by the propagation time through substrate 10.

As a bulk acoustic wave propagates through amorphous metal substrate 10, the phase of energization of input electrodes 19–22 shown in FIGS. 1–3 can be utilized to efficiently generate desired modes of pure Lamb waves. Since the piezoelectric transducers 15 and 17 exert out-of-plane forces on substrate 10 they are easily suited to the generation and detection of the lower order, anti-symmetric Lamb waves which propagate with minimal attenuation in amorphous metal substrate 10.

With the preferred embodiment of the invention described herein, the lowest asymmetric mode M21 of pure Lamb waves is excited in substrate 10 by applying the electrical signal to be delayed to input electrodes 19–22 as follows. The signal is applied to input electrodes 19 and 21, and the same signal shifted one-hundred-eighty degrees is applied to input electrodes 20 and 22. The lowest symmetric mode M11 of pure Lamb waves is excited in substrate 10 by applying the electrical signal to be delayed to input electrodes 19 and 22, and the same electrical signal shifted one-hundred-eighty degrees is applied to input electrodes 20 and 21.

Figure 4:
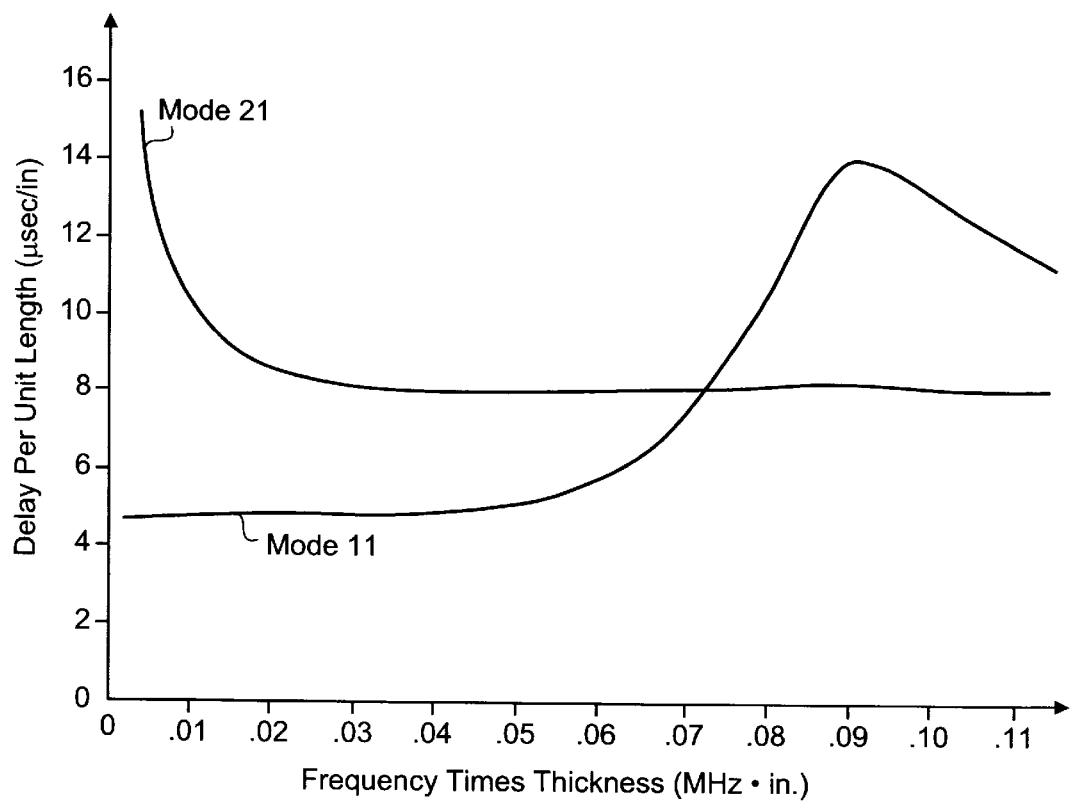
FIG. 4 shows a graph of pure Lamb wave lower order modes M11 and M21 generated in the preferred embodiment of the invention disclosed herein as a delay line.

Referring now to FIG. 4, therein is shown a graphical presentation of lower order Lamb wave modes M11 and M21 generated using a bulk acoustic wave delay line constructed in accordance with the teaching of the invention.

An acoustic bulk wave delay line constructed in accordance with the teaching the present invention is small, rugged, very stable, and capable of high-volume, low-cost production. The amorphous material is nonrigid and can be wrapped to form a compact package without generating large coupling losses. A simple method of insuring temperature stability is to provide a small heat source in close proximity to the bulk acoustic wave device.

It will be understood by those skilled in the art that there are many uses for acoustic bulk wave devices constructed using the teaching of the present invention. When used as part of a communication and imaging system, bulk acoustic waves propagating through the amorphous plate can be used as an intermediate carrier of information. Since the acoustic energy waves are intercepted with the electrodes, the information is accessible for signal processing. The mode M11 can be used on the dispersive element in chirp Fourier transform systems.

What is claimed is:

1. A bulk acoustic wave device producing selected modes of acoustic waves responsive to electrical signals applied to said device, said device comprising:

a substrate having a first surface and a second surface, and having a first end and a second end;

a piezoelectric material being bonded to both said first and said second surface of said substrate at both said first end and said second end of said substrate;

a first plurality of electrodes located on said piezoelectric material bonded to said first surface and at said first end of said substrate;

a second plurality of electrodes located on said piezoelectric material bonded to said first surface and at said first end of said substrate, said second plurality of electrodes being interspersed between said first plurality of electrodes;

a third plurality of electrodes located on said piezoelectric material bonded to said second surface and at said first end of said substrate;

a fourth plurality of electrodes located on said piezoelectric material bonded to said second surface and at said first end of said substrate, said fourth plurality of electrodes being interspersed between said third plurality of electrodes; and wherein said electrical signals having a first phase are applied to said first plurality and said fourth plurality of electrodes, and said electrical signals having a second phase are applied to said second plurality and said third plurality of electrodes to excite a first mode of acoustic waves in said bulk acoustic wave device; and wherein said electrical signals having a first phase are applied to said first plurality and said third plurality of electrodes, and said electrical signals having a second phase are applied to said second plurality and said fourth plurality of electrodes to excite a second mode of acoustic waves in said bulk acoustic wave device.

2. The invention in accordance with claim 1 wherein said substrate is made of an amorphous material having no grain structure.

3. The invention in accordance with claim 2 wherein said amorphous material is a metalized glass material.

4. The invention in accordance with claim 3 wherein said bulk acoustic wave device is a delay line.

5. The invention in accordance with claim 4 wherein said piezoelectric material is zinc oxide.

6. The invention in accordance with claim 5 further comprising:

a first bus bar interconnecting all of said first plurality of electrodes;

a second bus bar interconnecting all of said second plurality of electrodes;

a third bus bar interconnecting all of said third plurality of electrodes; and a fourth bus bar interconnecting all of said fourth plurality of electrodes.

7. The invention in accordance with claim 6 further comprising:

a fifth plurality of electrodes located on said piezoelectric material bonded to said first surface and at said second end of said substrate;

a sixth plurality of electrodes located on said piezoelectric material bonded to said first surface and at said second end of said substrate, said sixth plurality of electrodes being interspersed between said fifth plurality of electrodes;

a seventh plurality of electrodes located on said piezoelectric material bonded to said second surface and at said second end of said substrate; and an eighth plurality of electrodes located on said piezoelectric material bonded to said second surface and at said second end of said substrate, said eighth plurality of electrodes being interspersed between said seventh plurality of electrodes.

8. The invention in accordance with claim 1 wherein said first and said second modes of acoustic waves excited in said bulk acoustic wave device comprise pure modes of Lamb waves.

9. The invention in accordance with claim 8 wherein when said bulk acoustic wave device lies horizontal, said first plurality of electrodes located on said first surface are positioned vertically above said third plurality of electrodes located on said second surface, and said second plurality of electrodes located on said first surface are positioned vertically above said fourth plurality of electrodes located on said second surface.

10. The invention in accordance with claim 9 wherein said first mode of acoustic waves is mode M11 and said second mode of acoustic waves is mode M21.

* * * * *